United States Patent [19]

Gesell

[11] Patent Number: 4,839,608

[45] Date of Patent: Jun. 13, 1989

[54] CIRCUIT LAYOUT TO ELIMINATE ALTERNATING VOLTAGE INTERFERENCE SIGNALS

[75] Inventor: Ferdinand Gesell, Esslingen, Fed. Rep. of Germany

[73] Assignee: Eckardt AG, Stuttgart, Fed. Rep. of Germany

[21] Appl. No.: 257,222

[22] Filed: Oct. 13, 1988

[30] Foreign Application Priority Data

Oct. 17, 1987 [DE] Fed. Rep. of Germany ....... 3735285

[51] Int. Cl.$^4$ ............................................... H03F 1/26
[52] U.S. Cl. .................................... 330/149; 330/151; 330/258
[58] Field of Search ................ 330/69, 146, 149, 151, 330/252, 258

[56] References Cited

U.S. PATENT DOCUMENTS 3,550,013 12/1970 Gurol ............................. 330/149 X
4,129,853 12/1978 Althauser et al. ......... 340/146.3 AG
4,293,819 10/1981 Shibayama et al. ............ 330/151 X
4,484,146 11/1984 Naito ..................................... 330/69

OTHER PUBLICATIONS

Article: Elektronik 1962, #5 (pp. 131–133) "Transistoren und ihre Anwendungen in der Industrie".

Primary Examiner—Steven Mottola
Attorney, Agent, or Firm—Burns, Doane, Swecker & Mathis

[57] ABSTRACT

AC interference signals are eliminating during amplification of certain DC signals of interest in a low-pass amplifier by providing an auxiliary AC amplifier in like configuration as the low-pass amplifier, amplifying the interference signals in the auxiliary amplifier, and applying the resulting compensation signal to a summing node of the low-pass amplifier in counterphase to the original interference signals. Such an approach avoids much of the complexity and cost of prior art compensating networks.

7 Claims, 1 Drawing Sheet

CIRCUIT LAYOUT TO ELIMINATE ALTERNATING VOLTAGE INTERFERENCE SIGNALS

BACKGROUND OF THE INVENTION

The invention concerns a circuit layout for the elimination of alternating voltage interference signals superposed on direct voltage signals which are to be amplified. The direct voltage signals are to be amplified using a signal amplifier with low-pass characteristics to which both the alternating voltage interference signals and the direct voltage signals are passed.

The amplification of small direct voltage signals is a problem frequently arising in electrical or electronic measuring technology. In particular in remote measuring applications, because of the larger distance of the transducers to their evaluating locations and the need to pass such measuring signals over long lines to an amplifier, there is a high risk that interference signals will be superposed by induction on the measuring signal itself. The interference signals may be caused by the electromagnetic fields of the supply installation. They may also, however, be the result of inadequately filtered power supply and network devices, the interference signals appearing as so-called ripple voltages in the frequency range of 50 to 120 Hz, depending on whether the direct supply voltages are generated by half-wave or full-wave rectification in 50 or 60 Hz networks.

Since such interference signals no longer permit accurate measurements when the amplitudes of the interference signals attain or exceed those of the useful signals, means must be found to significantly weaken the interference signals with their harmful effects. It is known to use low-pass filters to suppress interference voltages in direct current lines of power units; such filters may be in the form of active or passive filters. An example of an electronic filter choke, the dc resistance of which is significantly lower than its dynamic resistance (ac resistance), is described in an article "Transistors and their applications in industry", Elektronik 1962, No. 5, page 132. Whereas passive low-pass filters require relatively large capacitors occupying much space, active low-pass filters consist of a larger number of electronic structural elements.

Like active low-pass filters, frequency dependent amplifiers are easier to provide. But they must also process interference signals, which may become a problem if the amplitude of the interference signals is several times that of the useful signals.

The harmful effects of interference signals may further be reduced by their compensation, as described for example in U.S. Pat. No. 4,129,853. Interference signals are generated by light sensitive transducers in the course of optical scanning performed on the basis of brightness fluctuations of the background and its illumination. Compensation is achieved by determining said interference signals, storing them, and subtracting them, during evaluation of the signal, from the overall signal.

Since the cost and complexity of such an approach is very high, in cases were a moderate technical investment and a high degree of reliability in the suppression of interference signals are required, such an approach is disadvantageous.

SUMMARY OF THE INVENTION

It is therefore the object of the present invention to provide a circuit layout having improved properties relative to the suppression of interference signals with a justifiable investment in components and high reliability.

The object of the invention is attained by providing an auxiliary signal amplifier coupled to receive and perform summing amplification of alternating voltage interference signals to produce a compensating signal which is then coupled in counter phase to the summing node of a main low-pass signal amplifier.

The present invention yields the advantage that, by improved compensation of the interference signals on measurement-value carrying lines, more precise remotely measured values may be obtained. The circuit layout for the elimination of inteference signals requires only a moderate overall component investment, while providing a high degree of reliability.

BRIEF DESCRIPTION OF THE DRAWING

The invention will become more apparent from an example of a preferred embodiment of a multiple conductor system described with reference to the following figures. In the drawing.

DETAILED DESCRIPTION OF A PREFERRED EMBODIMENT

Figure 1:
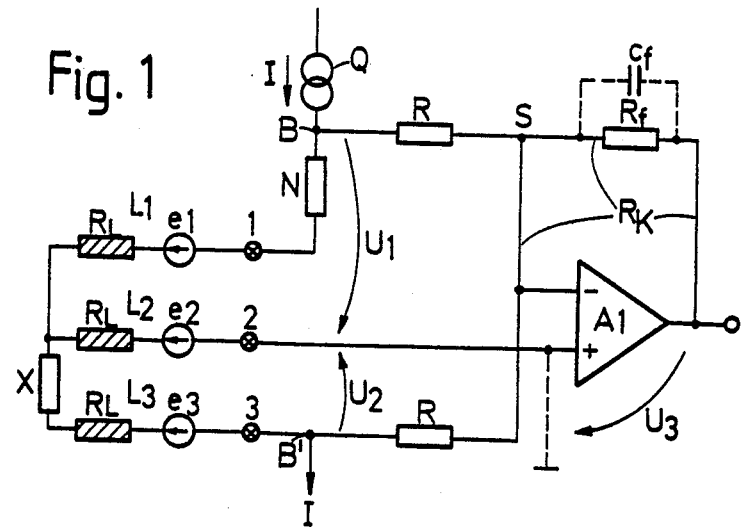
FIG. 1 shows a known three-conductor measuring layout for remotely measuring variations of the resistance of a resistor.

In the known layout according to FIG. 1, the current (I) supplied by a constant power source (Q) flows both through a standard resistance (N) and, by means of the lines ($L_1$ and $L_3$), through the resistance (X). The constant source of power (Q) is for example a current source with a very high internal resistance or a power source connected through a very high ballast resistance with the inlet points (B and B'). The line ($L_2$) remains as a so-called "feeler line" or reference line, without power. The signal voltages ($U_1$) generated by the current flow and the resistance variations of the measuring resistor (X) between the inlet point (B') and the line ($L_2$), are amplified in a signal amplifier ($A_1$) to produce a value ($U_3$). The signal amplifier ($A_1$) may, for example, be an operational amplifier connected as a summing amplifier.

The measuring lines ($L_1$ and $L_3$) are connected through a resistor (R) with the inverting input terminal (−) of the signal amplifier ($A_1$), while the line ($L_2$) is connected directly with the positive input terminal (+).

The following relationship is valid for $R \gg N, X$:

$$U_3 = \frac{-R_f}{R}(U_1 + U_2) = \frac{R_f}{R} \cdot I(X - N) = \frac{R_f}{R} \cdot \Delta U = V_1 \cdot \Delta U \tag{1}$$

The voltage drops through the line resistance $R_L$ of the feeder lines ($L_1$ and $L_3$) are not taken into consideration in this equation, as it may be assumed that these line resistances are equal in magnitude and therefore compensate each other. In the feedback path ($R_K$) of the operational amplifier ($A_1$) is located a resistor ($R_f$), the value of which is chosen so that a high amplification factor ($V_1$) is obtained. Since a capacitor ($C_f$) is connected in parallel with said feedback resistor ($R_f$), the frequency response of the amplifier, i.e. the amplification as a function of the signal frequency, acquires a low-pass characteristic of the form:

$$\frac{U_3}{\Delta U_1} = V_1 = \frac{R_f}{R(1 + p \cdot T_f)} = \frac{V_1}{1 + p \cdot T_f} \quad (2)$$

with $$p = j\omega; \quad T_f = R_f \cdot C_f \quad (3)$$

It is assumed further that in the measuring lines ($L_1$ to $L_3$) interference voltages are induced, which are designated ($e_1$ to $e_3$) in keeping with the indices of the measuring lines. The input signal ($U_1$) present at the signal amplifier ($A_1$) connected as an operational amplifier is calculated from the following relationship:

$$\Delta U_1 = I(X-N) - e_1 + 2 \cdot e_2 - e_3 = \Delta U_x + \Delta e \quad (4)$$

This signal is amplified according to Equation (2), whereby the interference signals designated in (4) by $\Delta e$ are also amplified.

Figure 2:
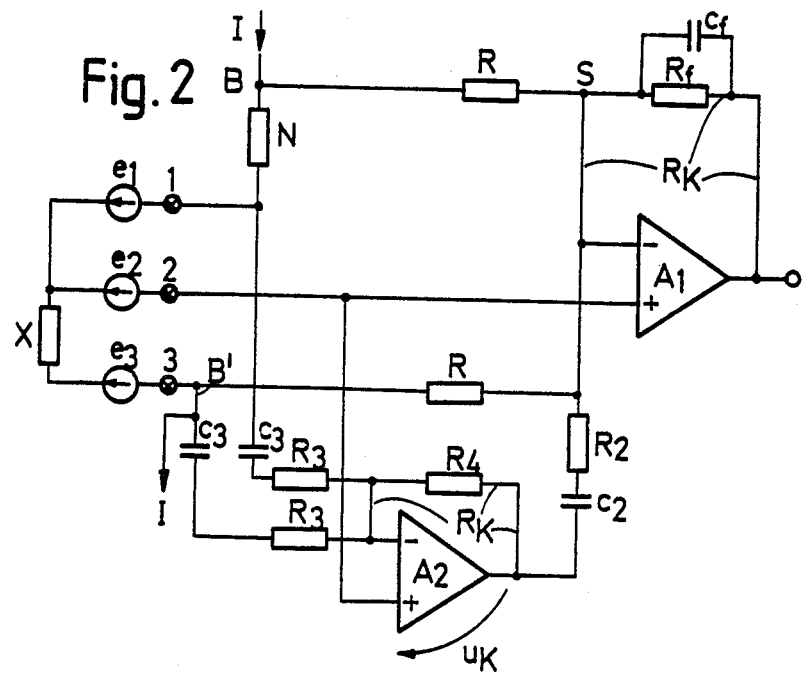
FIG. 2 is a circuit layout according to the invention with the introduction of the interference signals into the measuring amplifier in phase opposition to achieve compensation.

FIG. 2 shows a circuit layout modified by a compensation layout according to the invention. In this circuit layout the sum of the interference signals is amplified in an auxiliary amplifier ($A_2$) and subsequently returned in counter phase to the sum point (S) of the signal amplifier ($A_1$). In a manner similar to the signal amplifier ($A_1$) shown in FIG. 1, the operational amplifier connected as an ac amplifier ($A_2$) yields the compensating voltage ($^uK$) at its outlet. The interference signals ($e_1$ to $e_3$) are conducted to the auxiliary amplifier through a plurality of high pass series circuits consisting of a resistor ($R_3$) and a capacitor ($C_3$). The amplification factor ($V_1$) is set by means of the resistor ($R_4$) in the feedback path ($R_K$). The output signal, the compensating voltage ($^uK$), is conducted through a high pass series circuit consisting of a resistor ($R_2$) and a capacitor ($C_2$), to the sum point (S) of the signal amplifier ($A_1$), i.e. to the inverting input terminal (−) of the latter.

The compensating voltage ($^uK$) is calculated as follows:

$$^uK = \Delta e \cdot \frac{R_4}{R_3} \cdot \frac{p \cdot T_3}{(1 + p \cdot T_3)}; \quad T_3 = R_3 \cdot C_3 \quad (5)$$

As a pure ac amplifier, the auxiliary amplifier ($A_2$) ignores the dc components of the input signal, so that only the compensating voltage resulting from the interference signal components is applied in counter phase relative to the original interference signal ($\Delta e$) to the sum point (S) of the signal amplifier ($A_1$) through the high pass series circuit consisting of the resistor ($R_2$) and the capacitor ($C_2$). The following relationship results:

$$U_3 = V_1(\Delta U_x + \Delta e) - {}^uK \cdot \frac{R_f}{R_2}, \text{ with} \quad (6)$$

$$R_2 = R_2 \left( \frac{1 + p \cdot T_2}{p \cdot T_2} \right) \text{ and } T_2 = R_2 \cdot C_2$$

$$U_3 = \Delta U_x \cdot V_1 + \Delta e \cdot \quad (7)$$

$$V_1 \left[ 1 - \frac{R_4}{R_3} \cdot \frac{R}{R_2} \cdot \frac{p \cdot T_3}{(1 + p \cdot T_3)} \cdot \frac{p \cdot T_2}{(1 + p \cdot T_2)} \right]$$

As seen from Equation (7), complete compensation of an interference voltage sum ($\Delta e$) may be obtained if the parenthetical expression F is set equal to zero:

$$F = \left[ 1 - \frac{R_4}{R_3} \cdot \frac{R}{R_2} \cdot \frac{p \cdot T_3}{(1 + p \cdot T_3)} \cdot \frac{p \cdot T_2}{(1 + p \cdot T_2)} \right] = 0 \quad (8)$$

This cannot be attained by the simple low-pass filters of the circuit layout according to FIG. 2, i.e. with RC circuits. It is therefore proposed to effect an approximation of the compensation current as $p \to \infty$, since compensation as a vector operation is generally possible only if magnitudes are equal and the phase angles are exactly in counter phase. As $p \to \infty$, the following dimensioning is obtained:

$$\frac{R_4}{R_3} \cdot \frac{R}{R_2} = 1 \quad (9)$$

The interference signal is now transferred with:

$$\frac{U_3(\Delta e)}{\Delta e} = V_1 \cdot \frac{1}{(1 + p \cdot T_f)} \left[ \frac{(1 + p \cdot T_2) \cdot (1 + p \cdot T_3) - p^2 \cdot T_2 \cdot T_3}{(1 + p \cdot T_2) \cdot (1 + p \cdot T_3)} \right] \quad (10)$$

$$= V_1 \cdot \frac{1 + p(T_2 + T_3)}{(1 + p \cdot T_f) \cdot (1 + p \cdot T_2) \cdot (1 + p \cdot T_3)}$$

A pure low-pass characteristic of the circuit layout is obtained with dimensioning according to Equation (11).

$$T_f = T_2 + T_3 \quad (11)$$

Accordingly, the transmission behavior of the circuit layout corresponds to that of two disconnected RC elements in the amplifier path.

Since the auxiliary amplifier ($A_2$) is a pure ac amplifier, it is not affected with dc problems in the dimensioning of its impedances. But the ac component which must be further amplified in the signal amplifier ($A_1$) could be significantly reduced without the need for an interference by circuitry means with the dc behavior of said amplifier.

This type of interference compensation is not restricted to three-conductor systems as described above, but is applicable to sum signal amplifiers with an arbitrary number of inputs, wherein the weighting of the summation may be adapted to different conditions by the appropriate variation of the weighting resistors (R and $R_3$).

What is claimed is:

1. A circuit for eliminating alternating voltage interference signals superposed on direct voltage signals to be amplified, comprising:

a low-pass signal amplifier having a summing node for amplifying said dc signals;
an auxiliary signal amplifier; and
coupling means for coupling said dc signals and said ac signals to said low-pass signal amplifier, and an output of said auxiliary amplifier to said summing node of said low-pass signal amplifier;
whereby said ac signals undergo summing amplification by said auxiliary amplifier to produce a compensating signal and said compensating signal is coupled to said summing node in counter phase to said ac interference signals.

2. The circuit of claim 1 wherein said low-pass signal amplifier further comprises a three-conductor, bridge-type, resistance-measuring amplifier.

3. The circuit of claim 1 wherein said auxiliary amplifier is substantially a purely ac amplifier.

4. The circuit of claim 3 wherein said coupling means further comprises:
interference signal connecting elements conducting said ac signals to a plurality of inputs of said auxiliary amplifier and conducting said compensating signal from an output of said auxiliary amplifier to said summing node, said interference signal elements being chosen such that at very high frequencies a compensating current resulting from said compensating signal is substantially equal in magnitude to an interference current resulting in said low-pass signal amplifier from said interference signals.

5. The circuit of claim 4 wherein said interference signal connecting elements are high-pass circuits.

6. The circuit of claim 5 wherein said low-pass signal amplifier further comprises a feedback network including a low-pass circuit and wherein the sum of the time constants of said interference signal connecting elements substantially equals the time constant of said low-pass circuit.

7. The circuit of claim 4 in which any weighting of said ac signals carried out during the summing amplification of said auxiliary amplifier is made substantially identical to any weighting of said dc signals by said low-pass signal amplifier.

* * * * *